US007106089B2

(12) United States Patent
Nakano et al.

(10) Patent No.: US 7,106,089 B2
(45) Date of Patent: Sep. 12, 2006

(54) INSPECTION DEVICE AND INSPECTION METHOD FOR ACTIVE MATRIX PANEL, AND MANUFACTURING METHOD FOR ACTIVE MATRIX ORGANIC LIGHT EMITTING DIODE PANEL

(75) Inventors: Daiju Nakano, Sagamihara (JP); Yoshitami Sakaguchi, Hadano (JP)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 10/848,318

(22) Filed: May 18, 2004

(65) Prior Publication Data

US 2004/0246019 A1 Dec. 9, 2004

(30) Foreign Application Priority Data

May 21, 2003 (JP) ............................ 2003-142972

(51) Int. Cl.
*G01R 31/00* (2006.01)

(52) U.S. Cl. ..................................................... 324/770

(58) Field of Classification Search ........ 324/765–770, 324/158.1; 349/42–47; 315/169.1, 169
See application file for complete search history.

(56) References Cited

U.S. PATENT DOCUMENTS 5,179,345 A * 1/1993 Jenkins et al. .............. 324/678
5,428,300 A * 6/1995 Takahashi et al. .......... 324/770
6,791,350 B1 * 9/2004 Taguchi ....................... 324/770
6,815,975 B1 * 11/2004 Nara et al. ................. 324/770

FOREIGN PATENT DOCUMENTS

JP 2002-108243 4/2002

* cited by examiner

*Primary Examiner*—Vinh P. Nguyen
(74) *Attorney, Agent, or Firm*—Louis P. Herzberg

(57) ABSTRACT

An inspection method includes an array process of forming a TFT array on a substrate to fabricate an active matrix panel, an inspection process of carrying out a performance test on the fabricated active matrix panel, and a cell process of mounting an OLED on the active matrix panel after the inspection process. In the inspection process, variation in parasitic capacitance through a pixel electrode is measured when driving TFTs constituting the active matrix fabricated in the array process are turned on and when the driving TFTs are turned off, and open/short defects in the driving TFTs are thereby inspected.

14 Claims, 15 Drawing Sheets

(a)

(b)

(a)

APPLY VOLTAGE FROM DATA LINE (b) MEASUREMENT RESULTS

| | | | | |
|---|---|---|---|---|
| IN ALL-OFF STATE | 0Von1 + 3Voff1 | 1Von1 + 2Voff1 | 2Von1 + 1Voff1 | 0Von1 + 3Voff1 |
| WHEN ONLY RELEVANT PIXEL IS IN ON STATE | 1Von1 + 2Voff1 | 1Von1 + 2Voff1 | 3Von1 + 0Voff1 | 1Von1 + 2Voff1 |
| | 0Von1 + 3Voff1 | 2Von1 + 1Voff1 | 2Von1 + 1Voff1 | 1Von1 + 2Voff1 |
| | 0Von1 + 3Voff1 | 1Von1 + 2Voff1 | 2Von1 + 1Voff1 | 1Von1 + 2Voff1 |

INSPECTION DEVICE AND INSPECTION METHOD FOR ACTIVE MATRIX PANEL, AND MANUFACTURING METHOD FOR ACTIVE MATRIX ORGANIC LIGHT EMITTING DIODE PANEL

FIELD OF THE INVENTION

The present invention relates to an inspection device and the like for an active matrix organic light emitting diode (OLED) panel, and more specifically to an inspection device and the like for conducting performance inspection of a thin film transistor (TFT) array prior to an OLED formation process.

BACKGROUND

An OLED (also referred to as organic electro luminescence (EL)) is for conducting a direct current on a fluorescent organic compound which is excited by application of an electric field, and thereby causing light emission of the compound. The OLED is drawing attention as a next-generation display device in terms of low-profileness, a wide view angle, and a wide gamut, etc. Whereas a driving method for the OLED includes a passive type and an active type, the active type is suitable for achieving a large-screen and high-definition display in light of aspects involving a material, a life, and crosstalks. This active type requires thin film transistor (TFT) driving, and a TFT array applying low-temperature polysilicon or amorphous silicon (a-Si) is drawing attention for this use.

For example, U.S. Pat. No. 5,179,345 discloses (FIG. 2) a conventional inspection method for a TFT array in a liquid crystal display (LCD). The method is configured to observe electric charges accumulated in a pixel capacitor with an integration circuit after writing a voltage in the pixel capacitor and thereby to inspect whether the voltage is written properly. Meanwhile, U.S. Pat. No. 4,983,911 discloses (FIGS. 1–3) a method to optically inspect writing in a pixel capacitor by use of a photoelectric element. Moreover, Japanese Unexamined Patent Publication No. 2002-108243 (FIG. 2) discloses a technique for inspecting whether a pixel unit operates normally prior to formation of an EL element, which is configured to perform inspection while connecting a power source to a common pixel electrode before patterning a pixel electrode.

Now, description will be made on comparison between an active matrix OLED (AMOLED) and an active matrix liquid crystal display (AMLCD). FIGS. 14A and 14B are diagrams for comparing and explaining pixel circuits in the AMOLED and the AMLCD. FIG. 14A shows a pixel circuit of the AMOLED and FIG. 14B shows a pixel circuit of the AMLCD. In FIG. 14B, the pixel circuit of a TFT array is formed by a TFT 310 which is connected to a data line (Data) and a gate line (Gate). Meanwhile, in the AMOLED shown in FIG. 14A, a driving TFT 302 which is an open drain driving transistor is connected adjacently to a pixel capacitor of a circuit similar to the one shown in FIG. 14B, and an OLED 301 being a light emitting element is connected to the driving TFT 302.

The pixel circuit is closed within a TFT array substrate in the case of the AMLCD shown in FIG. 14B. On the contrary, in the case of the AMOLED shown in FIG. 14A, the pixel circuit is not closed within the TFT array substrate because the OLED 301 does not exist therein. Accordingly, the driving TFT 302 is configured to be open-drain (or open-source) while a drain side (or a source side) thereof is directly connected to a pixel electrode. Although there are at least two TFTs in the pixel circuit of the TFT array substrate in the AMOLED, it is impossible to conduct an electric current on the driving TFT only by input and output from a panel interface terminal.

In this event, to reduce manufacturing costs of the current AMOLED panels, it is necessary to carry out a performance test on the independent TFT array and forward only a non-defective product to a subsequent process. It is desired to measure the performance of the driving TFT 302 prior to mounting the OLED 301 in the manufacture of the AMOLED panel due to the reasons that: a product yield of the current TFT arrays for the AMOLED panels is not sufficiently high; raw material costs of the OLED 301 are high; a process for forming the OLED 301 occupies relatively a long time in the entire manufacturing process; and so on.

However, in the independent TFT array, the OLED which is a constituent of the pixel circuit is not mounted as described above, and the driving TFT 302 is set to an open-drain (or open-source) state. That is, in the process prior to mounting the OLED, the OLED 301 indicated by broken lines in FIG. 14A is not connected and a normal circuit is not therefore established. Accordingly, it is not possible to inspect open/short defects in the driving TFT 302 only by input and output to/from the panel interface terminal.

U.S. Pat. No. 5,179,345 and U.S. Pat. No. 4,983,911 solely show the methods of inspecting the pixel circuit of the TFT array for the AMLCD as shown in FIG. 14B and do not possess a mechanism for supplying an electric current to the driving TFT 302 shown in FIG. 14A. As a result, it is not possible to perform open/short measurement of the driving TFT 302 set to the open-drain (or open-source) state by use of the known techniques.

Meanwhile, the technique disclosed in Japanese Unexamined Patent Publication No. 2002-108243 is capable of measuring unevenness in resistance components depending on pixels. However, this technique is not designed to perform inspection after patterning the pixel electrodes. Therefore, this technique cannot inspect defects which are attributable to patterning. Moreover, although this technique can inspect a defect of the driving TFT 302, the technique cannot specify a type of such a defect (whether the defect is an open defect or a short defect). As a result, this technique cannot count the number of bright points or dark points (dead points), which are defects of a display device after formation of the OLED 301, or obtain data corresponding to an evaluation standard set up by an inspector, for example.

SUMMARY OF THE INVENTION

The present invention has been made in consideration of the foregoing problems.

One aspect of the present invention realizes inspection of open/short defects in driving TFTs in a TFT array prior to mounting OLEDs.

Another aspect of the present invention enables to grasp the number of bright points or dark points (dead points) being evaluation items of a display unit at a stage of a TFT array prior to mounting OLEDs and thereby to evaluate a defective panel prior to formation of the OLEDs.

Still another aspect of the present invention realizes calculation of unevenness in Von–Voff values in normally operating pixels within a panel and thereby to estimate accuracy of formation of pixel circuits.

The present invention has been made focusing on parasitic capacitance existing between a pixel electrode and a pixel circuit which are electrically open. The present invention realizes high speed inspection of an open/short defect in a driving TFT by inspecting variation of the parasitic capacitance when the driving TFT is turned on and off. Moreover, the present invention performs the inspection on the entire pixels constituting a panel to estimate the types and the number of the defects simultaneously, and thereby estimates the number of bright-point or dark-point (dead-point) defects of an AMOLED.

Specifically, as shown in FIG. 15, the present invention provides an inspection device 1510 for an active matrix panel 1540 for inspecting the panel before forming an OLED. A voltage changing means 1520 of the device changes a voltage on inspection wiring for a driving TFT which constitutes this active matrix panel. Then a measuring means 1530 of the device measures a transient current flowing on wiring on a source side of the driving TFT, and the measuring means 1530 further measures variation in parasitic capacitance between an off state and an on state of the driving TFT. Moreover, based on the measured variation in parasitic capacitance, the inspection device employs unevenness estimating means 1540 to estimate unevenness caused upon formation of pixel circuits constituting the active matrix panel by use of unevenness estimating means.

Here, the measuring means can measure the variation in the parasitic capacitance in all the pixels constituting the active matrix panel and thereby find the number of pixels having open/short defects in the driving TFTs thereof. Moreover, the measuring means can measure the transient current by use of an integration circuit connected to the source side wiring and thereby take an output from this integration circuit into a computer after converting the output into digital data with an A/D converter.

From another point of view, an inspection device for an active matrix panel is configured to measure parasitic capacitance through a pixel electrode in an off state of a driving TFT by use of off-state parasitic capacitance measuring means, to measure the parasitic capacitance through the pixel electrode in an on state of the driving TFT by use of on-state parasitic capacitance measuring means, and to inspect an open/short defect of the driving TFT by use of inspecting means based on the parasitic capacitance measured by the off-state parasitic capacitance measuring means and the parasitic capacitance measured by the on-state parasitic capacitance measuring means. Here, the on-state parasitic capacitance measuring means can perform charge pumping through the parasitic capacitance when a gate voltage of the driving TFT has a low initial voltage.

Moreover, the on-state parasitic capacitance measuring means estimates the parasitic capacitance on each line of the inspection wiring constituting the active matrix panel while setting the driving TFT of a pixel subjected to AC coupling directly with the relevant line of the inspection wiring to an on state. Meanwhile, the off-state parasitic capacitance measuring means estimates the parasitic capacitance on each line of the inspection wiring constituting the active matrix panel while setting the driving TFT of the pixel subjected to AC coupling directly with the relevant line of the inspection wiring to an off state. Moreover, the inspecting means can estimate the number of the pixels having open/short defects in the driving TFTs thereof by use of a difference between maximum/minimum values of the estimated parasitic capacitance and the individual parasitic capacitance.

Another aspect of the present invention is an inspection method for an active matrix panel for inspecting an active matrix panel prior to formation of an OLED, which includes a first step of measuring a value based on parasitic capacitance through a pixel electrode in an off state of a driving TFT constituting an active matrix panel, a second step of measuring a value based on the parasitic capacitance through the pixel electrode in an on state of the driving TFT, and an inspection process of inspecting an open/short defect of the driving TFT based on the value measured in the first step and the value measured in the second step.

Here, the values based on the parasitic capacitance through the pixel electrode in the first and second steps can represent a transient current which flows from the pixel electrode side to a source side through the parasitic capacitance. Moreover, the first step can be configured to estimate the value based on the parasitic capacitance on each line of the inspection wiring constituting the active matrix panel while setting the driving TFTs of all pixels subjected to AC coupling directly with the inspection wiring simultaneously to an off state. Furthermore, the second step can be configured to estimate the value based on the parasitic capacitance on each line of the inspection wiring constituting the active matrix panel while setting the driving TFTs of all the pixels subjected to AC coupling directly with the inspection wiring simultaneously to an on state.

Meanwhile, the present invention can be also regarded as a manufacturing method for an active matrix OLED panel. The manufacturing method includes an array process of forming a TFT array on a substrate and thereby fabricating an active matrix panel, an inspection process of inspecting a function of the fabricated active matrix panel, and a cell process of mounting an OLED on the active matrix panel after the inspection process. Here, the inspection process is configured to measure variation in parasitic capacitance through a pixel electrode when a driving TFT constituting the active matrix panel fabricated in the array process is turned on and off, and thereby to inspect an open/short defect of the driving TFT.

Here, the inspection process can be configured to measure the variation in parasitic capacitance of pixels constituting the active matrix panel and thereby to find the number of pixels having open/short defects in the driving TFTs thereof. Moreover, the inspection process can estimate unevenness caused when forming pixel circuits constituting the active matrix panel from the unevenness of the variation in parasitic capacitance of the pixels constituting the active matrix panel.

In addition, the inspection process can estimate the parasitic capacitance on each line of the inspection wiring while setting the driving TFT of a pixel subjected to AC coupling directly with the relevant line of the inspection wiring to an on state, and thereby estimate the number of the pixels having open defects in the driving TFTs thereof by use of a difference between a maximum value of the estimated parasitic capacitance and the individual parasitic capacitance. Moreover, the inspection process can estimate the parasitic capacitance on each line of the inspection wiring while setting the driving TFT of the pixel subjected to AC coupling directly with the relevant line of the inspection wiring to an off state, and thereby estimate the number of the pixels having short defects in the driving TFTs thereof by use of a difference between a minimum value of the estimated parasitic capacitance and the individual parasitic capacitance. Furthermore, the inspection method estimates the parasitic capacitance on each line of the inspection wiring when the driving TFTs of the pixels subjected to AC coupling directly with the inspection wiring are turned on and off, and estimates the number of the open/short defects on each line of the inspection wiring by use of differences among a minimum value and a maximum value of the estimated parasitic capacitance and the parasitic capacitance on each line of the inspection wiring.

BRIEF DESCRIPTION OF THE DRAWINGS

For a more complete understanding of the present invention and the advantages thereof, reference is now made to the following description taken in conjunction with the accompanying drawings.

FIG. 6A is a view showing equivalent circuits describing parasitic capacitance when a driving TFT is turned off.

FIG. 6B is a view showing equivalent circuits describing parasitic capacitance when a driving TFT is turned on.

DETAILED DESCRIPTION OF THE PREFERRED EMBODIMENT OF THE INVENTION

Now, the present invention will be described in detail based on an embodiment with reference to the accompanying drawings.

Figure 1:
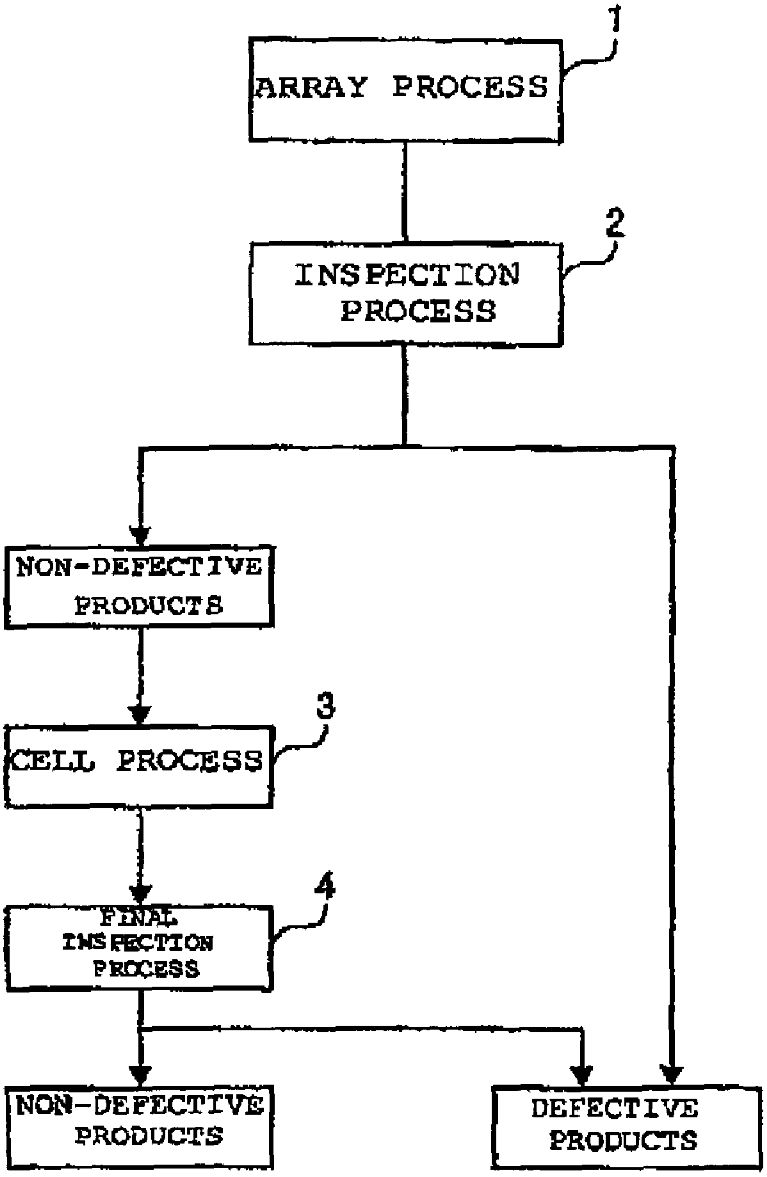
FIG. 1 is a view for explaining a manufacturing process of an OLED panel in accordance with an embodiment of the present invention.

FIG. 1 is a view for explaining a manufacturing process of an OLED panel in accordance with an embodiment of the present invention. The manufacturing method includes an array process 1 of fabricating a thin film transistor (TFT) array (an active matrix panel) which is a driving circuit for the OLED, and an inspection process 2 of carrying out a performance test on the independent TFT array thus fabricated. The inspection process 2 checks whether open/short defects of wiring are below a predetermined condition and whether characteristics of the driving TFTs constituting the TFT array are uniform throughout the panel. A TFT array judged as a defective product in this inspection process 2 will not be forwarded to a subsequent process but removed instead. A TFT array judged as a non-defective product will be forwarded to a cell process 3 of forming the OLED on the TFT array and then to a final inspection process 4. In this final inspection process 4, products will be finally sorted into non-defective products and defective products. In this embodiment, the inspection process 2 is provided prior to the cell process 3. Accordingly, it is possible to carry out inspection of open/short defects in pixel circuits, or more particularly, inspection of peripheries of the driving TFTs, prior to mounting the OLED. Objects of such inspection include active matrix (AM) panels used as display screens for personal handy phone systems (PHS) and cellular phones, and various active matrix OLED (AMOLED) panels.

Now, the inspection process 2 will be described in detail.

Figure 2:
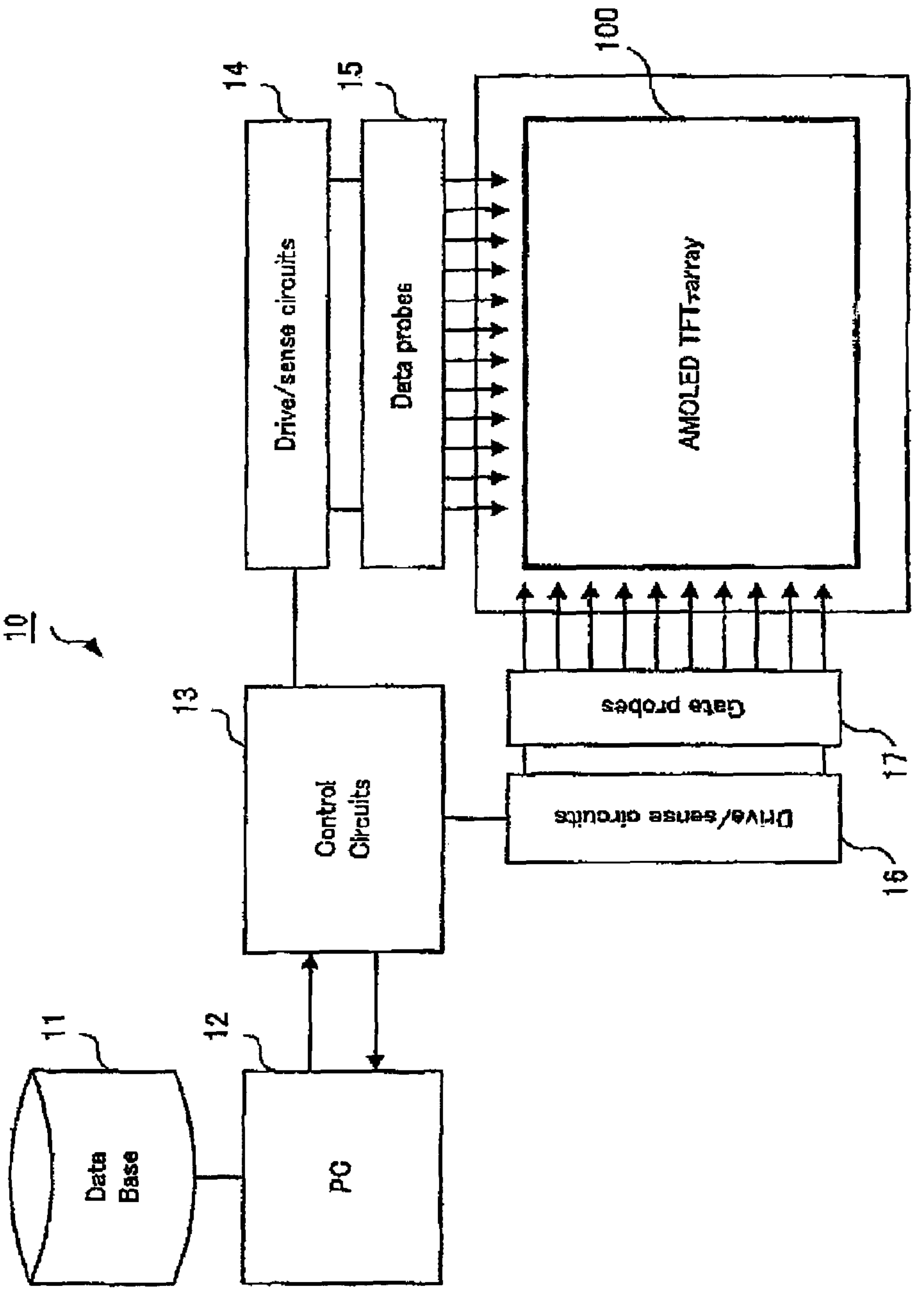
FIG. 2 is a block diagram of a test device used in the inspection process in accordance with another embodiment of the present invention.

FIG. 2 is a block diagram of a test device used in the inspection process. A test device 10 includes a storage device (Data Base) 11, a computer (PC) 12, measurement control circuits (Control Circuits) 13, signal generation and signal measurement circuits (Drive/sense circuits) 14, probes (Data probes) 15, signal generation and signal measurement circuits (Drive/sense circuits) 16, and probes (Gate probes) 17. With this configuration, the test device 10 inspects open/short defects in the driving TFTs in a TFT array (an active matrix panel) 100.

The storage device 11 of the test device 10 stores information necessary for judging whether the TFT array 100 being the inspection object is defective or non-defective, and also stores information necessary for measurement. The computer 12 is comprised of a personal computer (PC), for example, and is configured to execute judgment processing in response to inputted data based on the information stored in the storage device 11. The measurement control circuits 13 manage measurement sequences of an inspection method to be described later. Meanwhile, the signal generation and signal measurement circuits 14 and 16 are analog circuits configured to generate driving signals for the AMOLED and to obtain output waveforms from the TFT array 100. Integration circuits to be described later are mounted on these signal generation and signal measurement circuits 14 and 16. The probes 15 and 17 supply the AMOLED driving signals generated by the signal generation and signal measurement circuits 14 and 16 to the TFT array 100, and also obtain waveforms from the TFT array 100.

In the test device 10, the measurement sequences of the inspection method to be described later are managed by the measurement control circuits 13, and the AMOLED driving signals are generated by the signal generation and signal measurement circuits 14 and 16 and are supplied to the TFT array 100 through the probes 15 and 17. Moreover, the waveforms from the TFT array 100 are inputted to the signal generation and signal measurement circuits 14 and 16 through the probes 15 and 17 for observation. The observed signals are converted into digital data by the measurement control circuits 13 and then inputted to the computer 12. The computer 12 performs processing of the measurement data and judgment of defective products while making reference to the information stored in the storage device 11. Here, the respective constituents of the test device 10, such as the measurement control circuits 13 and the signal generation and signal measurement circuits 14 and 16 function as part of off-state parasitic capacitance measuring means and on-state parasitic capacitance measuring means, as well as part of voltage changing means and measuring means. Meanwhile, the computer 12 functions as part of unevenness estimating means and inspecting means, for example.

Description will be made below on the inspection method for the driving TFTs to be executed by use of the test device 10 in the inspection process 2.

First, description will be made on a pixel circuit of the AMOLED which is the object of measurement.

Figure 3:
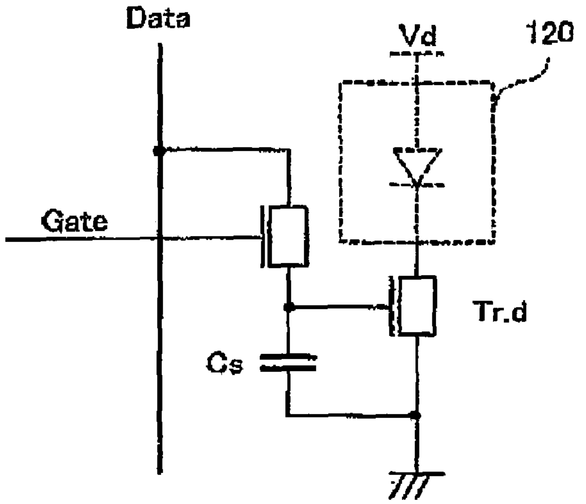
FIGS. 3A and 3B are views for explaining an AMOLED pixel circuit.
Figure 3:
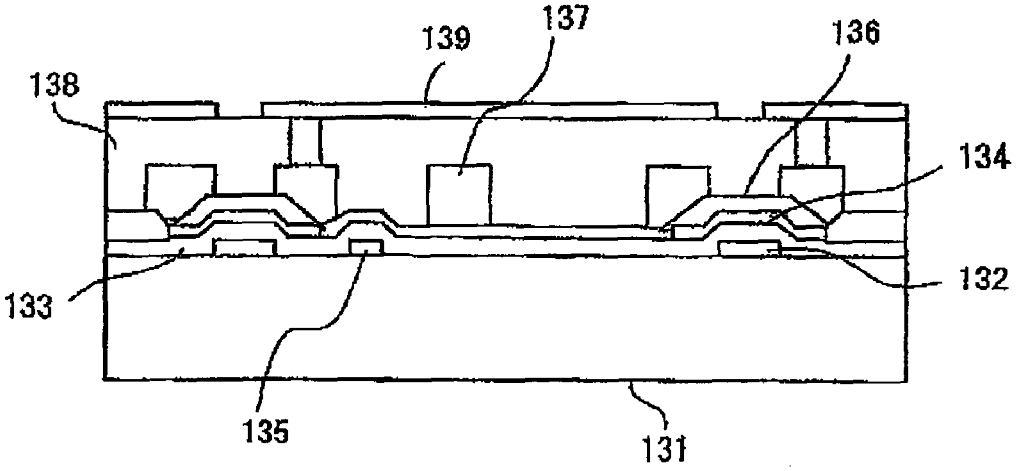

FIGS. 3A and 3B are views for explaining the AMOLED pixel circuit. FIG. 3A shows the AMOLED pixel circuit applying the simplest two-TFT structure. An OLED 120 illustrated by broken lines is not mounted yet at this stage. FIG. 3B is a cross-sectional view of the AMOLED pixel circuit designed to emit light from a glass substrate side of the TFT, which is so-called a bottom-emission structure. In the AMOLED pixel circuit shown in FIG. 3B, gate electrode 132 and gate metal wiring 135 are formed on a substrate 131 made of, for example, a glass substrate, and these constituents are covered with a gate insulating film 133. Moreover, a channel 134 is formed thereon and the channel 134 is covered with an insulating film 136. Source metal wiring 137 is formed on the insulating film 136, and these constituents are covered with a protective film 138. A pixel electrode 139 is formed on this protective film 138. Although the pixel electrode 139 and the channel 134 are disposed opposite to each other in a so-called top emission structure which is designed to emit light from an upper part of the substrate 131, the pixel electrode 139 and the channel 134 are not disposed opposite to each other in the bottom emission structure shown in FIG. 3B. As shown in FIG. 3B, an area of the pixel electrode 139 occupies the most part of the pixel and the pixel circuit is formed in a space within a very short distance. Accordingly, parasitic capacitance is generated in that space.

Figure 4:
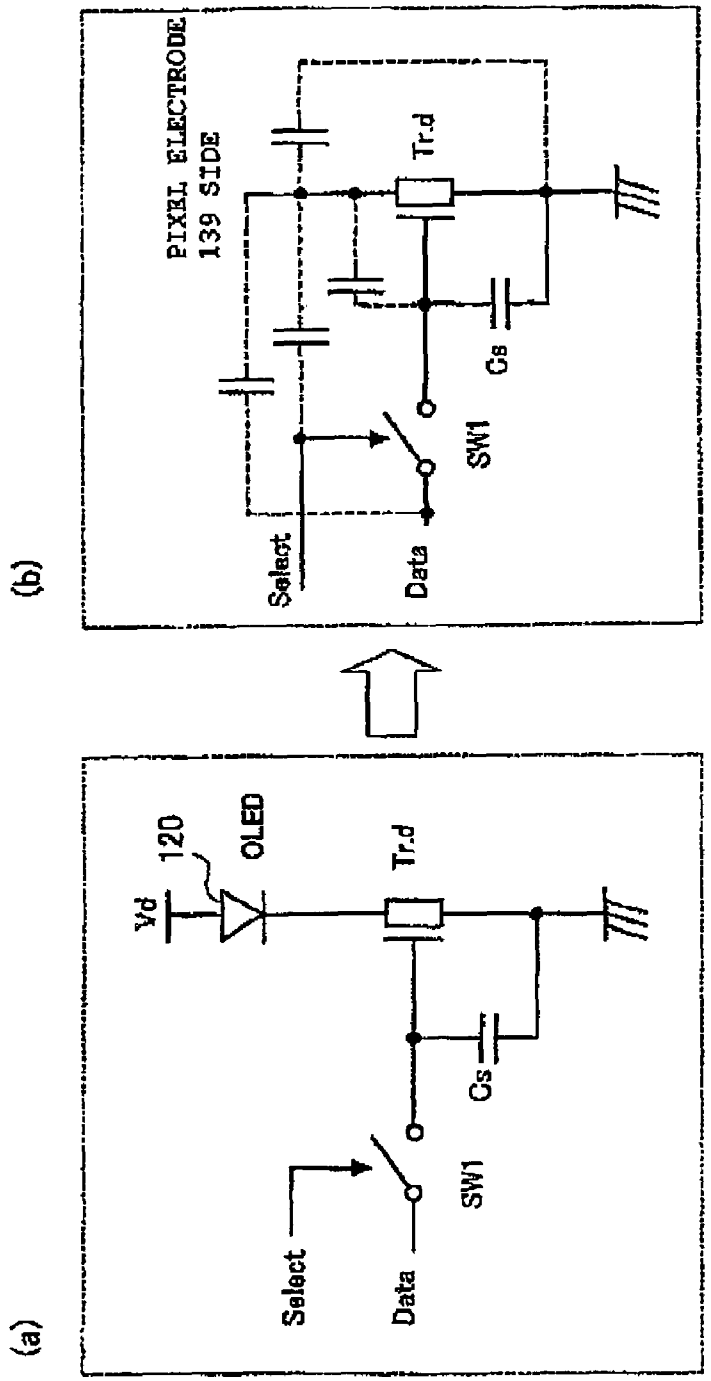
FIG. 4A shows an example of two-TFT pixel circuit in which OLED 120 is implemented.
FIG. 4B shows status of the two-TFT pixel circuit before the OLED 120 is implemented.

FIG. 4A shows an example of two-TFT pixel circuit in which OLED 120 is implemented. FIG. 4B shows status of the two-TFT pixel circuit before the OLED 120 is implemented. FIG. 4B shows a state where parasitic capacitance occurs in spaces between respective wiring for the driving TFT (Tr. d) including a data line (Data), a select line (Select), a gate line and a ground (GND), and the pixel electrode 139. The amount of the parasitic capacitance varies depending on the configuration or layout of the pixel circuit. However, the parasitic capacitance of substantially the same amount occurs in each pixel in a panel which applies uniform specifications. It is possible to judge defects in formation of the pixel circuits by inspecting unevenness in parasitic capacitance among all the pixel circuits.

Next, a flow of the inspection processing executed in the inspection process 2 will be described.

Figure 5:
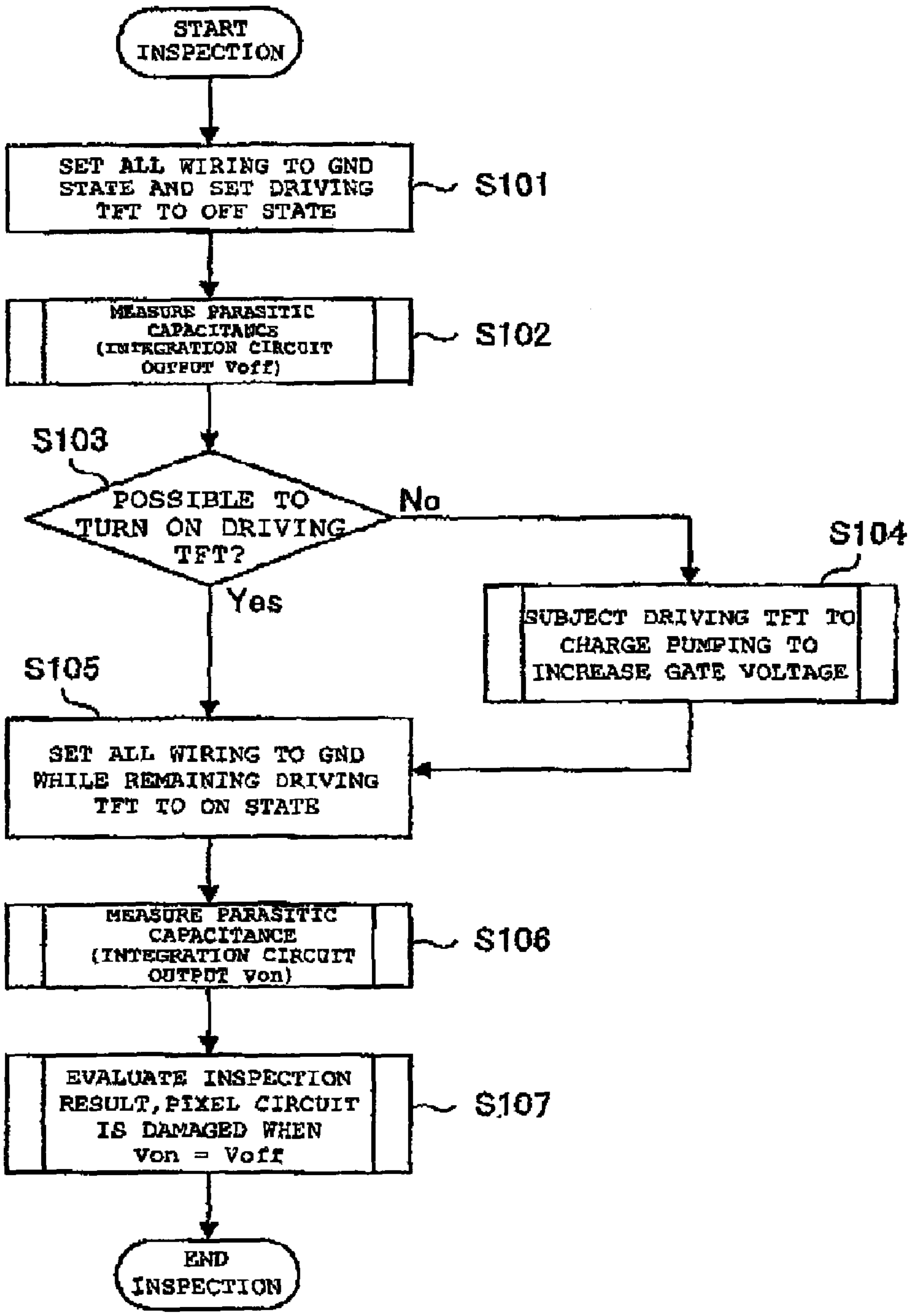
FIG. 5 is a flowchart showing a flow of parasitic capacitance measurement.

FIG. 5 is a flowchart showing a flow of the parasitic capacitance measurement. Here, variation in capacitance between the pixel electrode 139 and the GND through the parasitic capacitance is measured by applying a voltage change to the inspection wiring, such as the data line (Data), in the state where the driving TFT is turned on (ON) and the state where the driving TFT is turned off (OFF).

Figure 6:
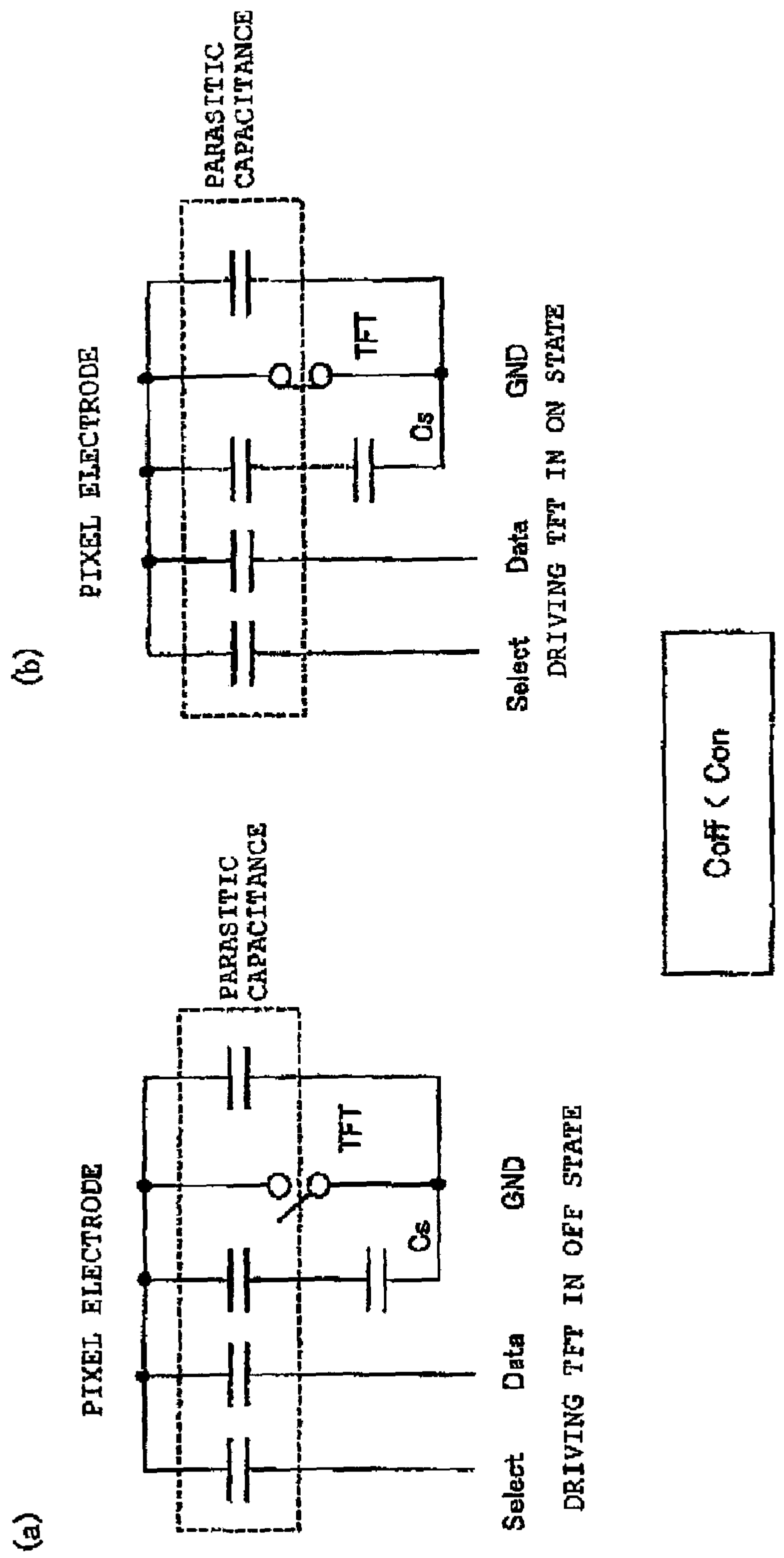

FIGS. 6A and 6B show equivalent circuits describing the parasitic capacitance when the driving TFT is OFF and when the driving TFT is ON. FIG. 6A shows the state where the driving TFT is OFF and FIG. 6B shows the state where the driving TFT is ON. As shown in FIG. 6B, when the driving TFT is turned ON properly, the GND and the pixel electrode 139 are directly connected together and the parasitic capacitance existed parallel to the TFT disappears. Instead, the parasitic capacitance existing between the data line (Data) and the GND becomes larger. Therefore, when a voltage is applied to the data line (Data), more electric charges flow at the ON state. The variation in parasitic capacitance between these two states is measured in the measurement processing shown in FIG. 5.

To describe in more detail based on the flowchart of FIG. 5, in the measurement processing, all the wiring is set to the GND in the beginning and the driving TFTs are turned OFF (Step S101). To be more specific, in the basic two-TFT circuit shown in FIG. 4B, the select line (Select) and the data line (Data) are set to the GND, then all the select lines (Select) are selected and a voltage sufficient for turning OFF the driving TFTs is applied to the data line (Data). All the driving TFTs are turned OFF accordingly. Thereafter, a predetermined voltage is applied to the data line. In this event, a transient current flows from the pixel electrode 139 side to the GND through the parasitic capacitance. The transient current is measured by an integration circuit (to be described later) connected to the GND side which is source side wiring. That is, an integration circuit output Voff is obtained in the state of turning OFF the driving TFT (Step S102).

Figure 7:
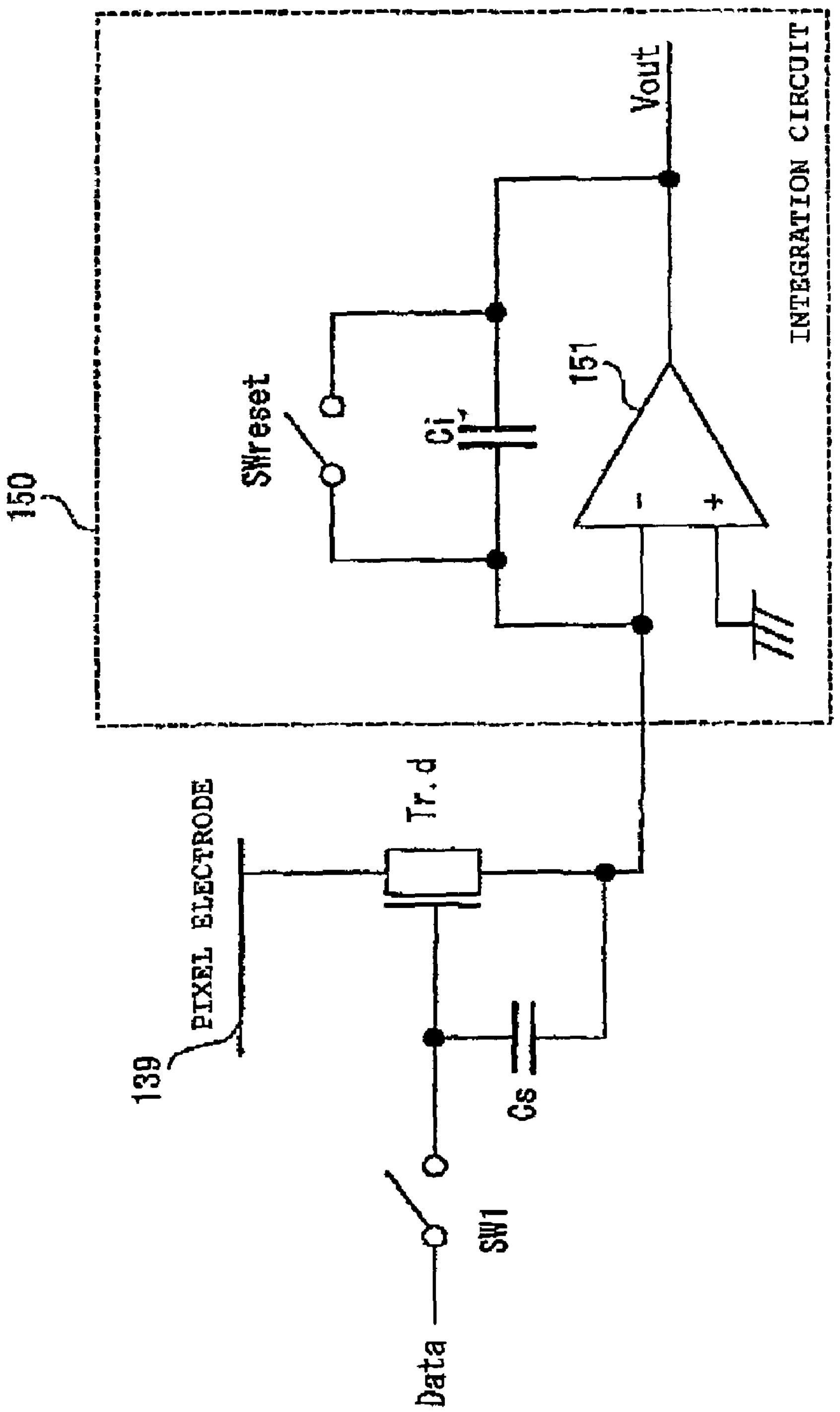
FIG. 7 is a view showing an example of an integration circuit for observation of an electric current to be outputted from the driving TFT.

FIG. 7 is a view showing an example of an integration circuit for observation of an electric current to be outputted from the driving TFT. FIG. 7 shows the case where an integration circuit 150 is connected to the circuit shown in FIG. 4B. Such an integration circuit 150 is provided to each of the signal generation and signal measurement circuits 14 and 16 shown in FIG. 2. The integration circuit 150 shown in FIG. 7 includes an operational amplifier 151, a capacitor Ci, and a reset switch SWreset. Here, the source side of the driving TFT Tr. d is set to GND potential due to an imaginary short circuit caused by the integration circuit 150. The integration circuit 150 can be similarly connected to other pixel circuits. An output from the integration circuit 150 is converted into digital data by an A/D converter circuit to be provided to the measurement control circuits 13 shown in FIG. 2 and taken into the computer 12. In this way, subsequent estimation processing becomes possible.

After the integration circuit output Voff is obtained in Step S102 of FIG. 5, judgment is made as to whether the driving TFT connected to the integration circuit 150 can be turned ON (Step S103). In this event, when it is not possible to turn ON the driving TFT easily such as a case of a four-TFT circuit, charge pumping (to be described later) is executed through the parasitic capacitance to raise a gate voltage of the driving TFT (Step S104). Then, the process proceeds to the next Step S105. When it is possible turn ON the driving TFT, the process proceeds directly to Step S105.

Figure 8:
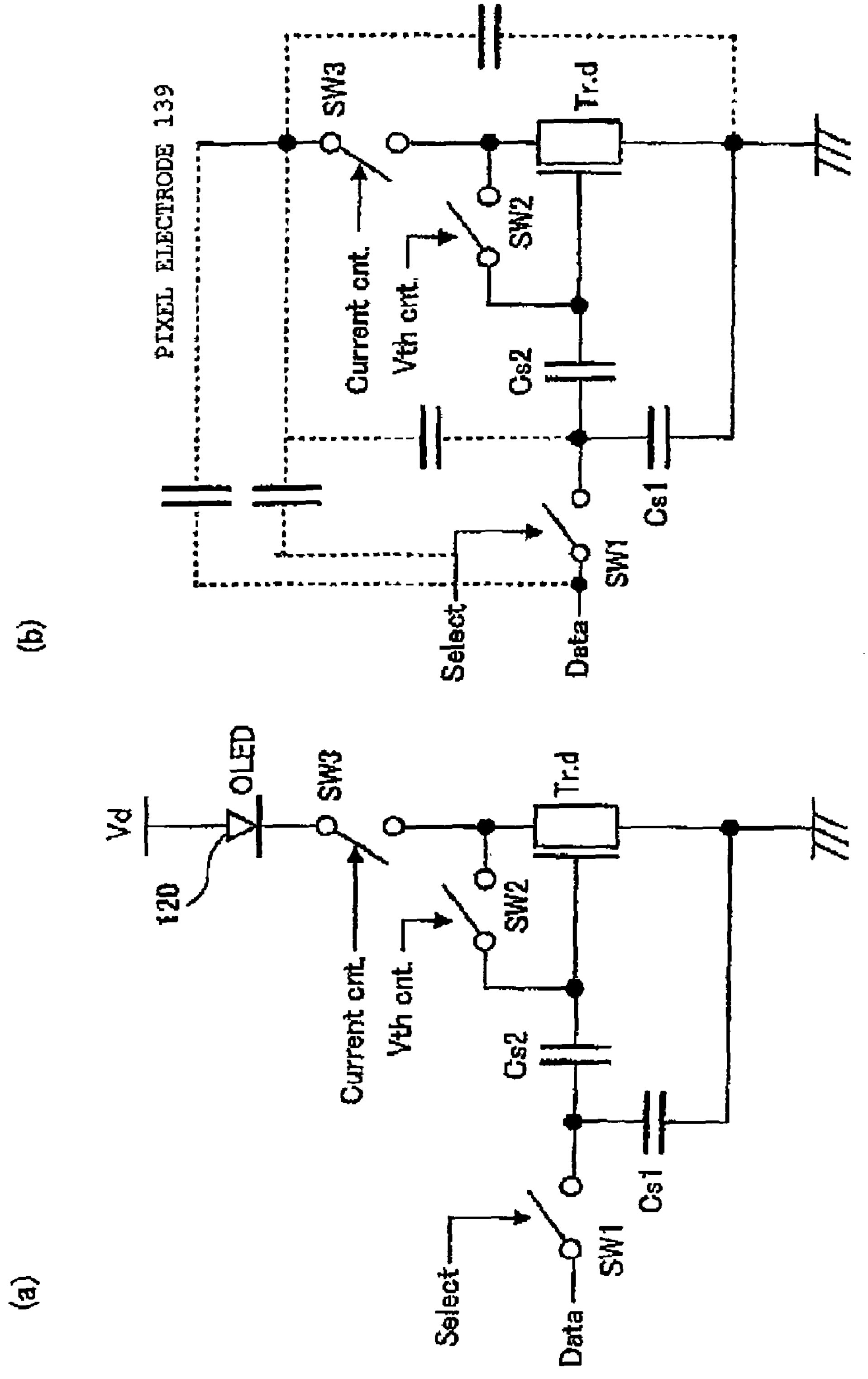
FIGS. 8A and 8B are diagrams for explaining pixel circuits applying a four-TFT structure.

FIGS. 8A and 8B are diagrams for explaining a pixel circuit applying a four-TFT structure. FIG. 8A shows an AMOLED pixel circuit applying a basic four-TFT structure, and FIG. 8B is the diagram for explaining the circuit on the array substrate prior to formation of the OLED 120. A switch SW1 shown in FIGS. 8A and 8B is turned ON by the select line (Select) when writing a gray scale voltage into the pixel capacitor Cs1. A switch SW2 is controlled by a Vth correction control line (Vth cnt.) and a switch SW3 is controlled by a current switch control line (Current cnt.), whereby electric charges are accumulated in a pixel capacitor Cs2. Prior to forming the OLED 120, the parasitic capacitance occurs between the pixel electrode 139 and each line of the wiring as shown in FIG. 8B. Note that only principal parasitic capacitance is described herein.

Figure 9:
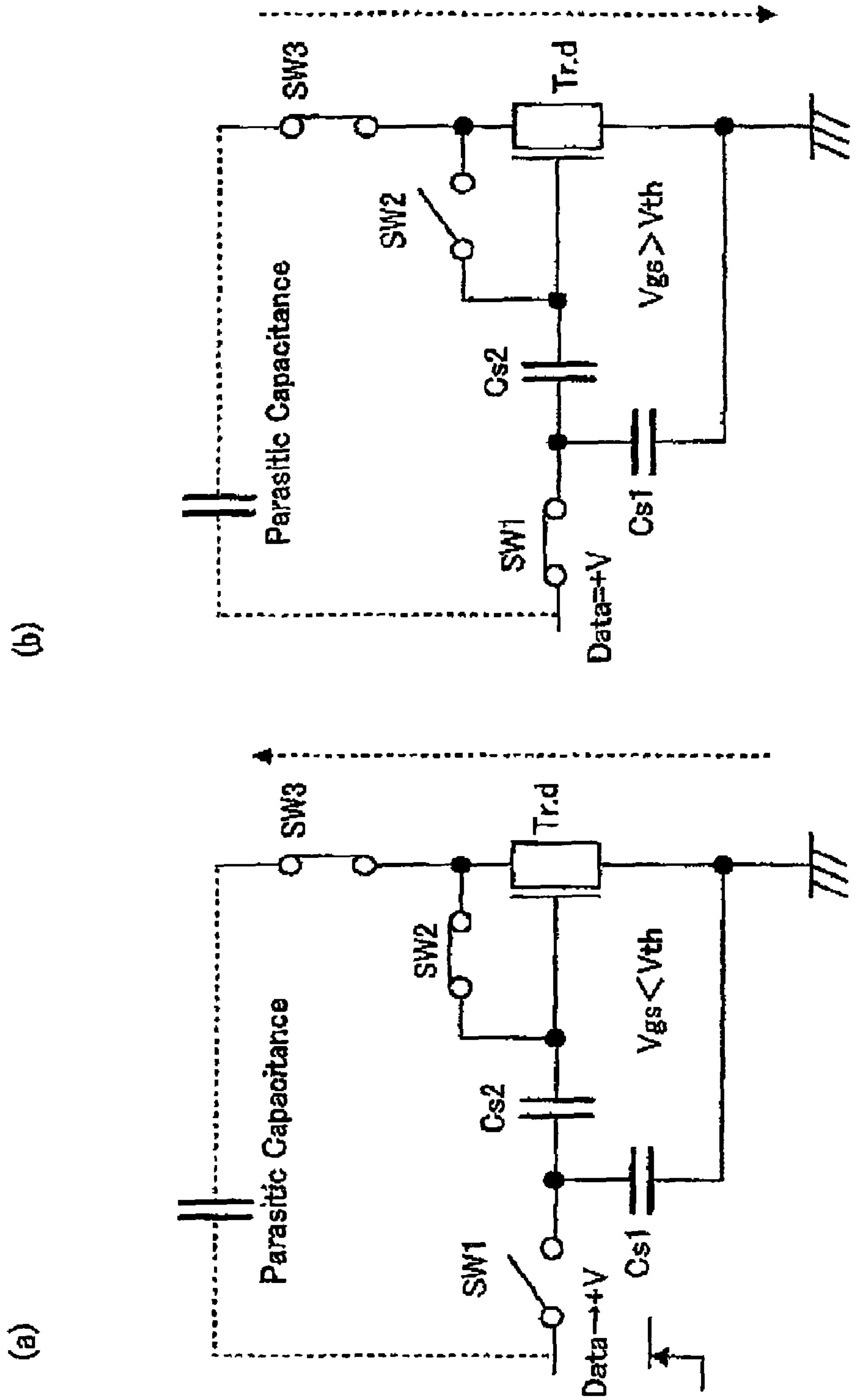
FIGS. 9A and 9B are diagrams for explaining a charge pumping operation.

FIGS. 9A and 9B are diagrams for explaining a charge pumping operation. In procedures for the charge pumping operation, the switch SW3 of a pixel subject to measurement is firstly turned ON. The switches SW3 for other pixels (pixels not subject to measurement) are turned OFF. Moreover, the switches SW1 and SW2 are turned OFF. Now, when driving potential V is written in the data line (Data), drain potential of the driving TFT (Tr. d) is increased via the parasitic capacitance. Thereafter, the switch SW2 is turned ON for a certain period as shown in FIG. 9A. In this event, the electric potential is redistributed through the parasitic capacitance and the pixel capacitors Cs2 and Cs1, and gate potential of the driving TFT Tr. d is slightly increased. As shown in FIG. 9B, when the switch SW1 is turned ON while maintaining the switch SW2 at the OFF state, the driving TFT Tr. d is turned ON and the electric current is confirmed if the gate potential of the driving TFT Tr. d exceeds a threshold voltage Vth since the driving potential V is applied to the data line Data. In this way, the charge pumping operation is completed. On the contrary, even if the driving TFT Tr. d is not turned ON, the driving TFT Tr. d has a channel width which is sufficiently larger than the switch SW2. Accordingly, the drain potential of the driving TFT Tr. d is set to the GND potential due to a leak current. Thereafter, the switch SW1 is turned OFF and the data line Data is set to GND potential. Then, the switch SW1 is turned ON again. The charge pumping operation is executed by means of repeating the above-described procedures until the driving TFT Tr. d is turned ON and the electric current is confirmed.

A pixel targeted for inspection is selected in Step S105 of FIG. 5, and a voltage sufficient to turn ON the driving TFT is applied from the data line (Data) to set the driving TFT to the ON state. For example, when the gate voltage of the driving TFT possesses a low initial voltage in such as a voltage programming mode using four TFTs, the charge pumping operation shown in Step S104 is executed. Meanwhile, in a current programming mode, the driving TFT is set to the ON state by means of conducting an electric current on the data line (Data). In this event, a gate-source voltage is accumulated in a pixel capacitor Cs. As described above, when the driving TFT is set to the ON state, the select line (Select) of the selected pixel is turned OFF to be set to a non-selective state. Then, the data line (Data) is also set to the GND state.

In parasitic capacitance measurement processing in Step S106, a voltage similar to the voltage in Step S102 is applied to the data line (Data) at the above-described state. In this event, a transient current flows again from the pixel electrode 139 side to the GND through the parasitic capacitance. This transient current is measured by the integration circuit 150 as similar to Step S102. The voltage thus obtained is an integration circuit output Von. Then, the select line (Select) of the pixel under inspection is turned ON. At the same time, electric charges sufficient for turning OFF the driving TFT are applied to the data line and the driving TFT is thereby set to the OFF state. The processing described as Step S105 and Step S106 are performed on all the pixels to be driven by one data line (Data). Moreover, Steps S101 to S106 of FIG. 5 are performed on all the data lines (Data). It is possible to obtain charge amounts flowing when the driving TFTs are ON regarding all the pixels by carrying out the above-described procedures. Here, the integration circuit output Von for each pixel is obtained when a GND line to be connected to an inverting input of the integration circuit 150 is independent. On the contrary, the integration circuit output Von for each line is obtained when the GND line is bundled.

Results of inspection are evaluated in Step S107. When the driving TFT of the pixel subject to inspection is properly turned ON, a charge amount flowing when the driving TFT is turned ON and a charge amount flowing when the driving TFT is turned OFF show mutually different values. In other words, when comparing the value Voff when one driving TFT is set to the OFF state with the value Von when the driving TFT is set to the ON state, Voff≠Von is satisfied when the driving TFT operates normally. If there is no difference between these values, or in other words, if Voff=Von is satisfied, it is possible to judge the pixel circuit to be damaged and the driving TFT thereof to be either open or short-circuited. In this way, it is possible to complete the series of inspection.

Here, if a minimum value (a minimum Voff value: Voff. min) is selected from the charge amounts of all the data lines at the OFF state, it is possible to assume that the minimum value represents the case where all the pixels operate normally. Therefore, it is possible to estimate the number of short-circuited pixels (Nshort) by use of a difference between that value and a value of each data line (Data) at the OFF state. In this way, it is possible to estimate a proportion of pixels having short defects and pixels having open defects, namely:

$$Voff-Voff.\ min=Nshort*(Von1-Voff1)$$

$$Nfault=Nshort+Nopen$$

Here, Nfault denotes the number of defective pixels measured repeatedly regarding all the data lines (Data), and Nopen denotes the number of pixels having open defects. Moreover, Von1 corresponds to a charge amount for one pixel that flows through the parasitic capacitance when the pixel is at the ON state, and Voff1 corresponds to a charge amount for one pixel that flows through the parasitic capacitance when the pixel is at the OFF state. To find (Von1−Voff1) specifically, the minimum value of all the (Von−Voff) values obtained from all the pixels is to be selected.

Next, this embodiment will be described in detail by use of a more concrete example of the two-TFT voltage programming pixel circuit.

Figure 10:
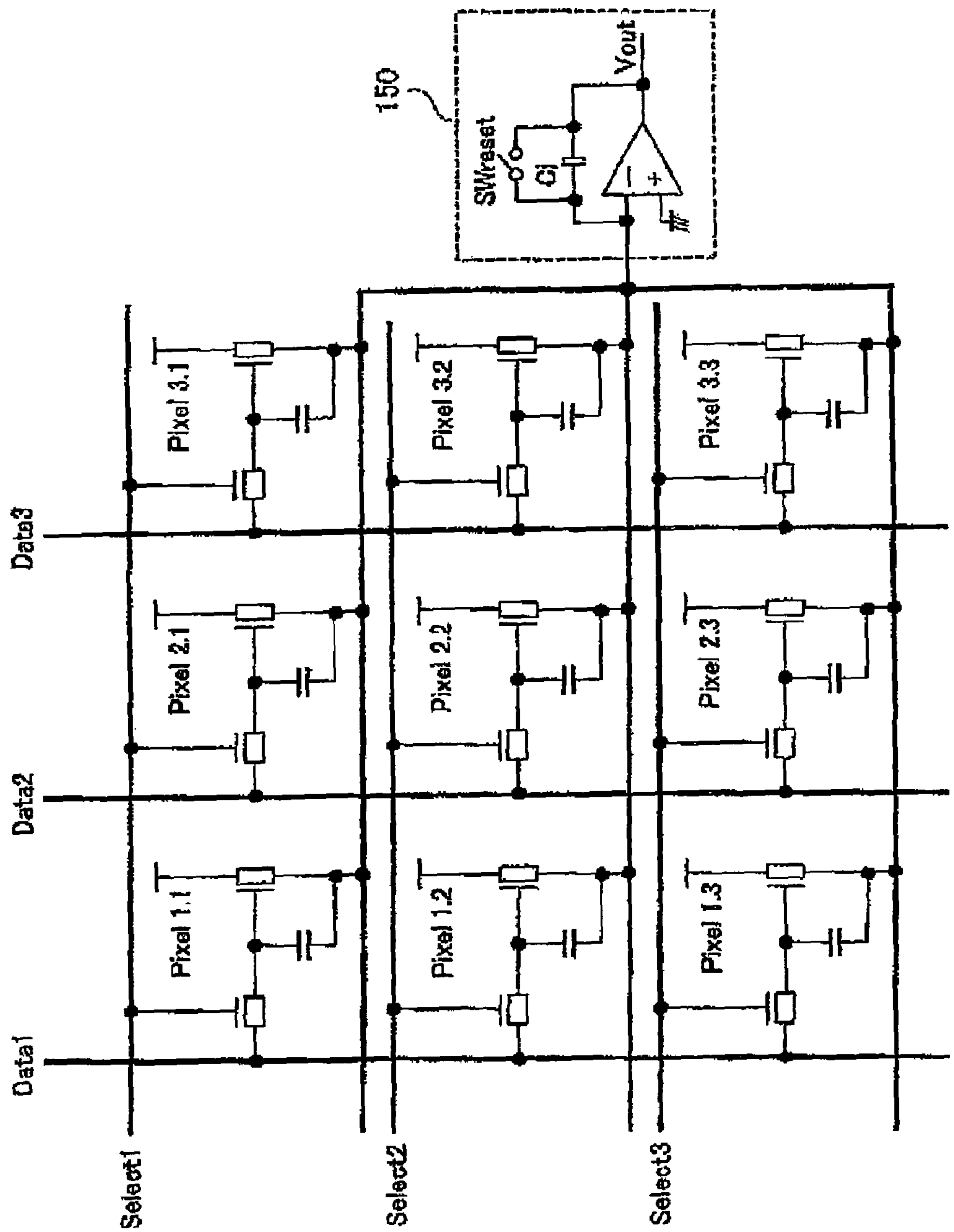
FIG. 10 is a view showing an example of a voltage programming panel in which each pixel circuit includes two TFTs.

FIG. 10 is a view showing an application example of the embodiment to a voltage programming panel in which each pixel circuit includes two TFTs. The application example shown in FIG. 10 illustrates nine (3×3) pixels as part of the panel. In FIG. 10, a pixel subject to measurement is the pixel in the center, and the integration circuit 150 is connected to GND lines for the respective pixels. Actual measurement is performed by repeating the above-described measurement method for all the pixels. Here, in the integration circuit 150, although it is possible to connect GND lines independently to the inverting input of the integration circuit 150, it is also possible to bundle some GND lines (or all the GND lines) to provide a common GND line as shown in FIG. 10. If the integration circuits 150 are provided in the number of groups of the bundled GND lines, it is possible to perform measurement for the respective groups in parallel. Note that the GND lines will be substituted by power lines when p-channel driving TFTs are applied thereto.

Figure 11:
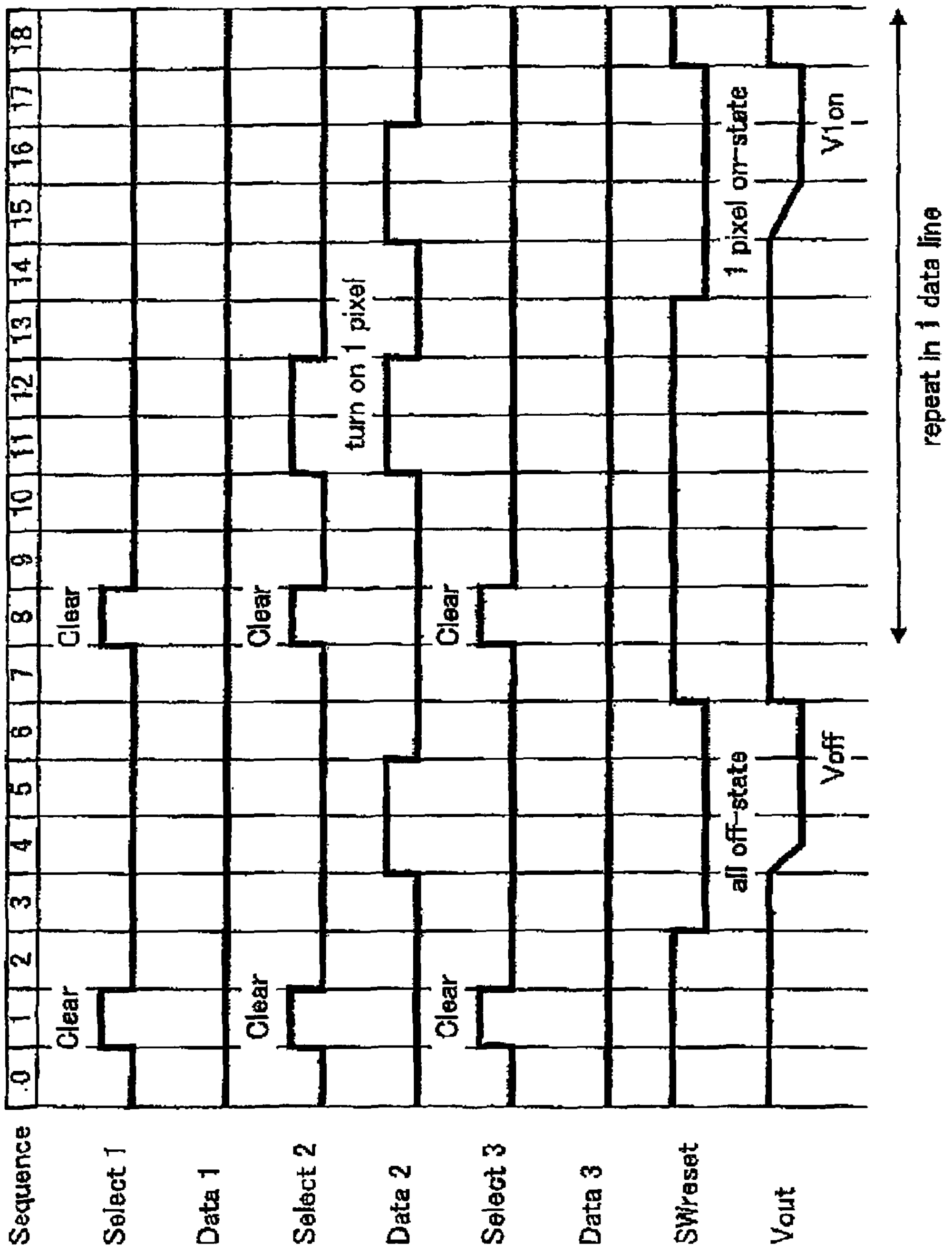
FIG. 11 is a view showing driving waveforms used in measurement.

FIG. 11 is a view showing driving waveforms used in the measurement. In the two-TFT voltage programming pixel circuit as shown in FIG. 10, it is possible to drive the driving TFTs directly through the data lines. Accordingly, it is possible to set the driving TFTs to the ON state without using the above-described charge pumping operation.

Here, description will be made based on sequences which are indicated on the uppermost row of FIG. 11.

Sequence 1: An OFF voltage is written in all the pixels to put out the light of the panel.

Sequence 4: ON potential is applied to Data 2 in an all-OFF state, and electric charges flowing at this time are measured.

Sequence 8: An OFF voltage is written in all the pixels again to put out the light of the panel.

Sequence 11: ON potential is applied to Select 2 and simultaneously to Data 2 and the driving TFT of the pixel subject to measurement is thereby set to the ON state.

Sequence 15: The same voltage as the voltage applied in Sequence 4 is applied to Data 2, and the electric charge flowing at this time is measured.

Sequence 18: Measurement is completed.

The procedures from Sequences 8 to Sequences 18 are repeated for all the pixels to be driven by the same data line, and the procedures from Sequence 0 to Sequence 18 are repeated for all the data lines.

The computer 12 performs the following calculation using the output waveforms of the integration circuit 150 obtained in the above-described procedures.

FIGS. 12A and 12B are views showing an example of inspection results of the AMOLED shown in FIG. 10. FIG. 12A exemplifies normal, open, and short pixel states corresponding to the respective pixels shown in FIG. 10. FIG. 12B shows values detected by the integration circuit 150 in the all-OFF state and in the state where each of the pixels is solely turned ON. Since the pixels aligned in the longitudinal direction are influenced by a single data line (Data), the charge amounts at the all-OFF state are obtained for the respective data lines (Data 1 to Data 4). Since the charge amounts are measured by the integration circuit 150, the charge amounts are converted into output voltages of the integration circuit 150. Assuming that a value of a driving TFT of a pixel in an OFF state is Voff and a value of the driving TFT of the pixel in an ON state is Von, then output values are as shown in FIG. 12B when the pixels bear defects as shown in FIG. 12A. The driving TFT remains in the OFF state in the case of an open defect and remains in the ON state in the case of a short defect.

The output obtained in the ON state and the output in the all-OFF state of the driving TFT of each of the pixels are compared, and a pixel having no difference between these values can be judged as a defective pixel. A pixel having different values operates normally, and variation Von−Voff is always equal to Von1−Voff1. To be more specific, the capacitance corresponding to Von−Voff is in the order of several femtofarads to several tens of femtofarads. Unevenness in the Von−Voff values among the pixels including the normally operating driving TFTs can be regarded as unevenness in design dimensions. Accordingly, such unevenness can be also used for judging the design quality. In this way, it is possible to judge defects of the pixels by inspecting all the pixels.

Moreover, as described above, the number of pixels included in the all-OFF state to be measured by one data line depends on the number of bundled GND lines. For example, when all GND lines are bundled together in a video graphics array (VGA: resolution of 640×480 dots) panel, 480 pixels are measured simultaneously with one data line. However, the AMOLED is current-driven and it is therefore a common practice to draw GND lines for several bundles instead of bundling all the pixels so as to avoid current concentration. In this case, the number of pixels per GND line is reduced. It is possible to measure each pixel when the panel includes the GND lines provided for respective pixels.

Figure 12:
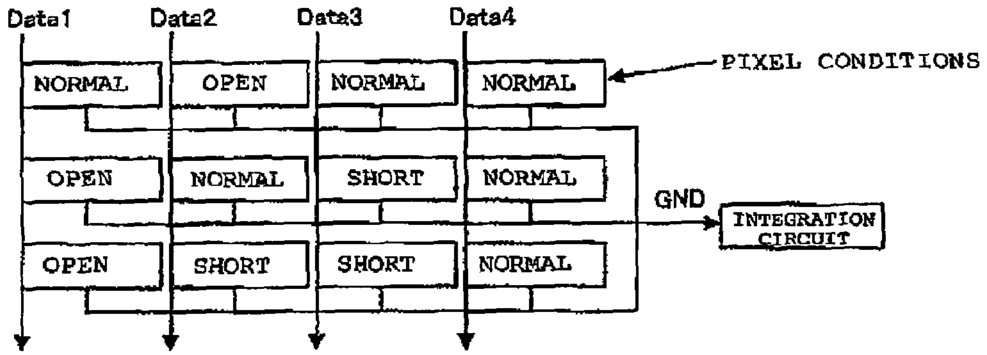
FIGS. 12A and 12B are views showing an example of inspection results of an AMOLED.

A common GND line is provided to every three lines in the example shown in FIG. 12. In this case, the output values at the OFF state of the respective data lines are compared, and the minimum value thereof can be estimated as the value representing the state where all the pixels are operating normally. In the example shown in FIG. 12B, the output value at the right end line (Data 4) is 3 Voff. That is, the minimum value at the all-OFF state is 3 Voff and all the pixels on the right end line (Data 4) are deemed normal. A value calculated by dividing a difference between the above-mentioned value and an output value of a defective column by the variation Von1−Voff1 is equal to the number of short defects.

In the case shown in FIGS. 12A and 12B, for example, measurement of the respective columns will be resulted as:

Data 1: (3 Voff1−3 Voff1)/(Von1−Voff1)=0: no short defects

Data 2: (1 Voff1+2 Voff1−3 Voff1)/(Von1−Voff1)=1: one short defect Data 3: (2 Von1+1 Voff1−3 Voff1)/(Von1−Voff1)=2: two short defects The total number of defective pixels (the number of pixels whose values at the ON state showed no difference from the values at the all-OFF state): 6 the number of short defects:the number of open defects=3:3

In this way, according to this embodiment, it is possible to estimate the proportion between the short defects and the open defects.

Here, it is possible to perform the inspection at higher speed by applying the above-described inspection method.

For example, regarding each line of the inspection wiring constituting the active matrix OLED panel, the parasitic capacitance is estimated as described above on all the pixels subjected to AC coupling directly with the inspection wiring (which are the pixels that belong to a relevant column in the case of the data line (Data), for example) in the cases of setting the driving TFTs thereof simultaneously to the OFF state and to the ON state. Then, the number of open/short defects in each line of the inspection wiring is estimated from differences among the minimum values, the maximum values, and the parasitic capacitance of each line of the inspection wiring. Moreover, after the estimation, the respective pixels in the lines of the inspection wiring including the open/short defects are extracted and inspected again as described above, so that estimation is made as to whether each defective pixel is an open defect or a short defect. It is possible to perform the inspection at higher speed by adopting the stepwise measurement procedures as described above.

Figure 13:
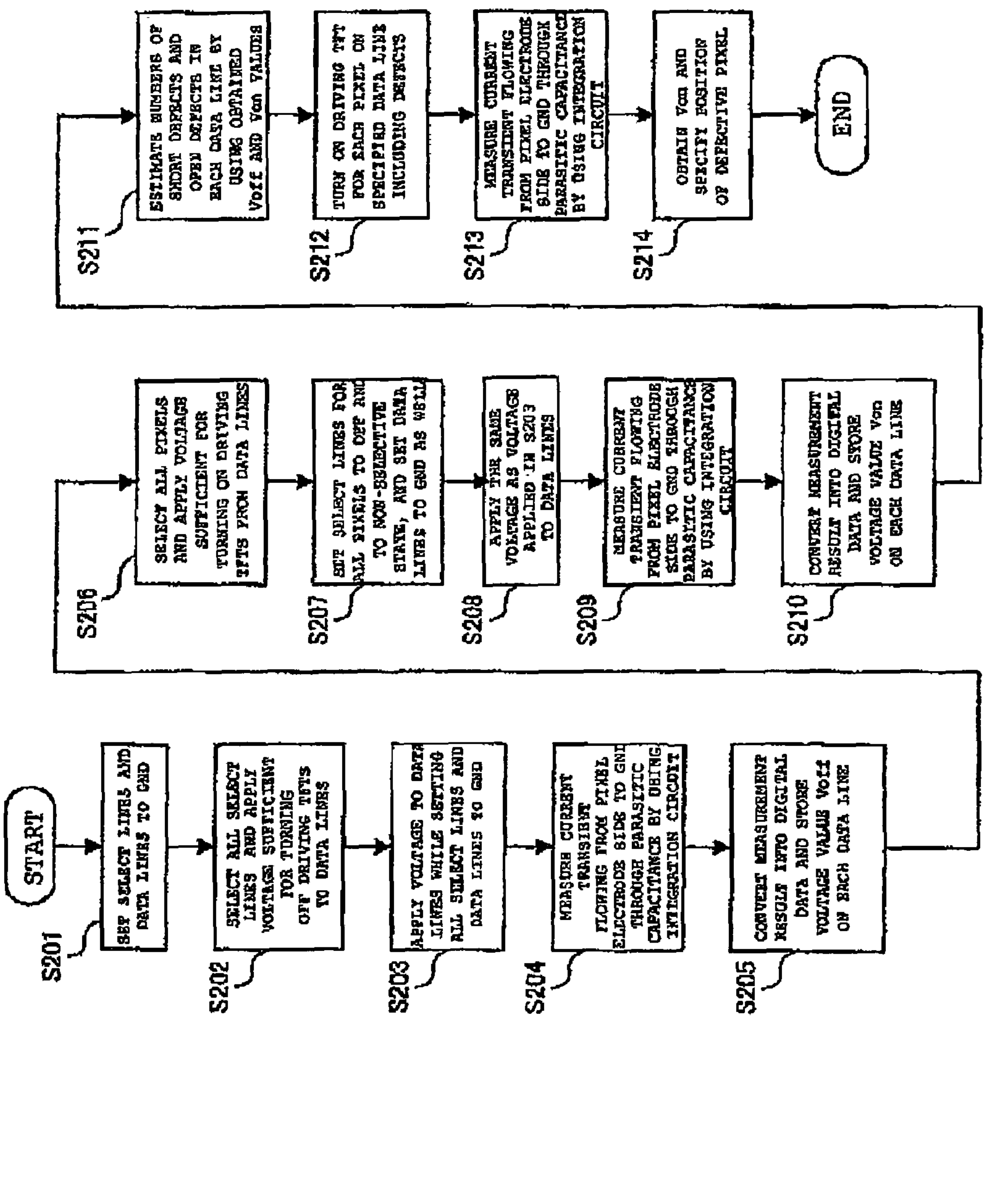
FIG. 13 is a flowchart showing a stepwise inspection method which is applied to a basic two-TFT circuit.
Figure 14:
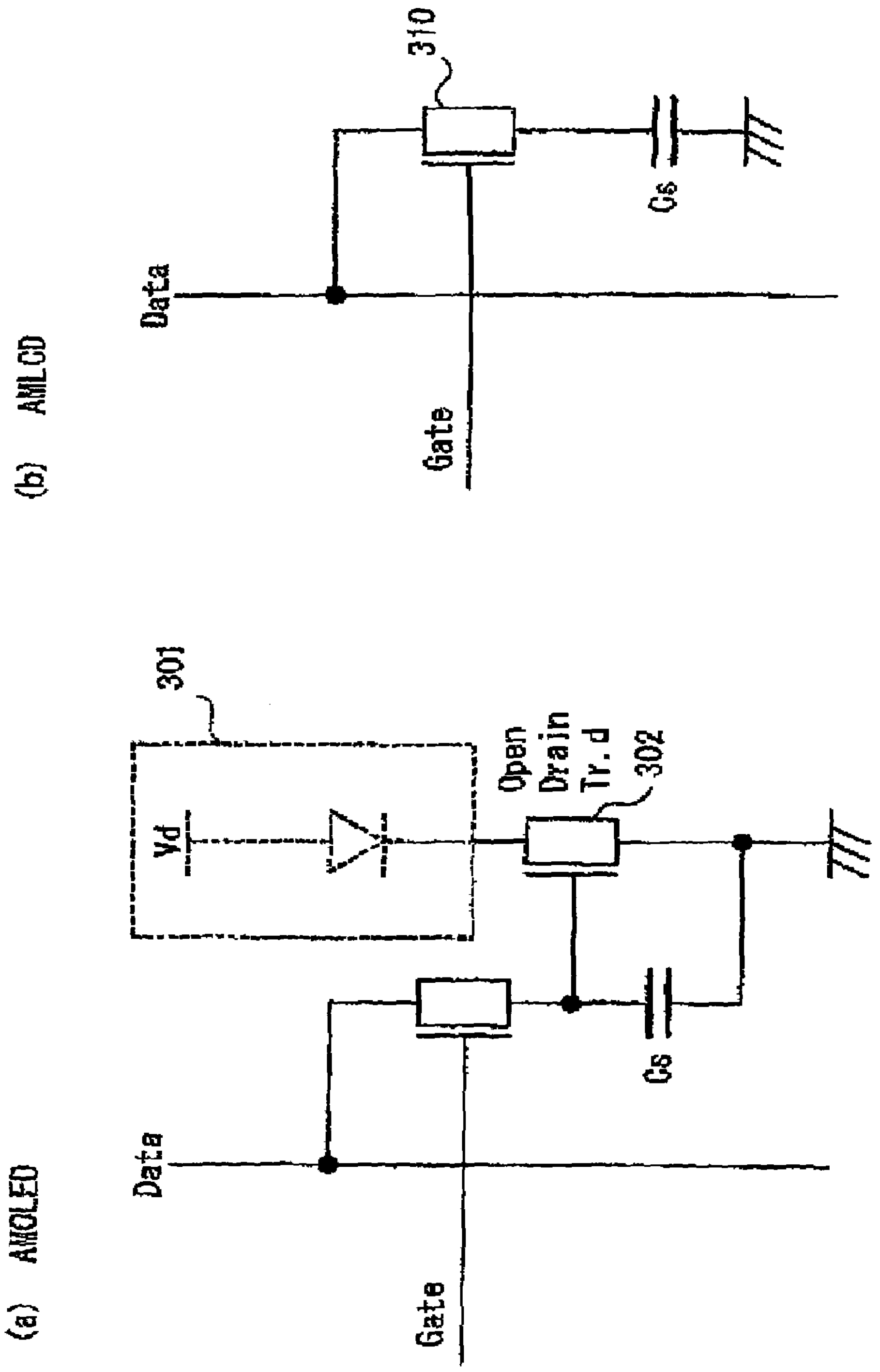
FIGS. 14A and 14B are diagrams for comparing and explaining pixel circuits in an AMOLED and an AMLCD.
Figure 15:
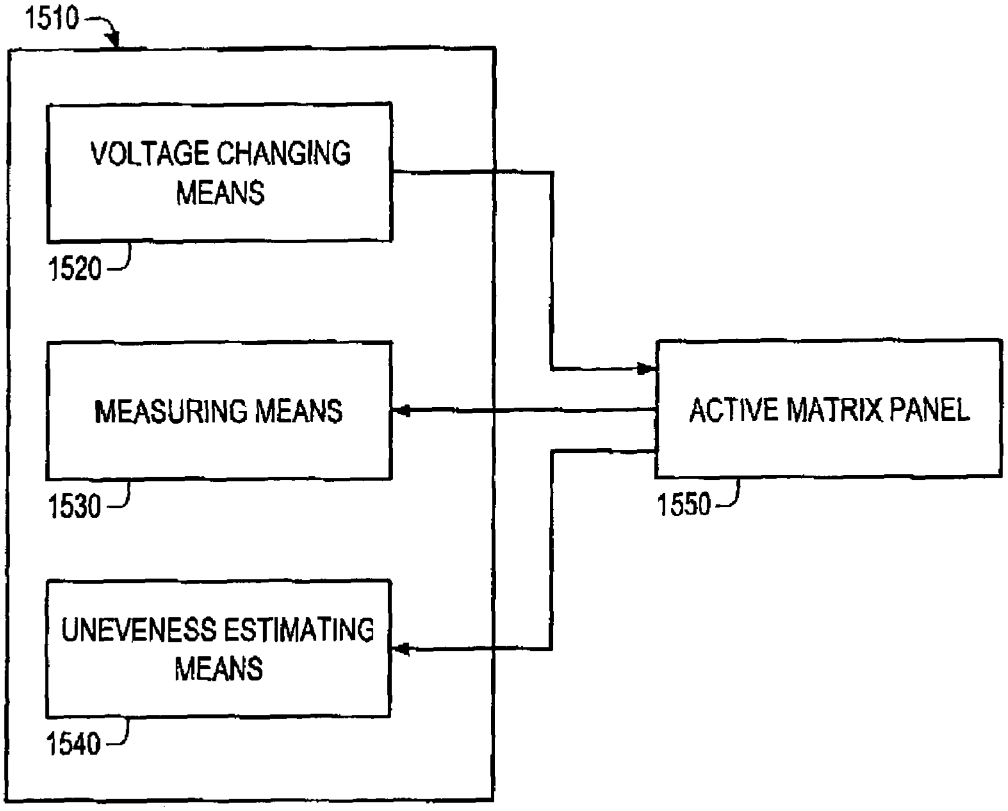
FIG. 15 shows a diagram for an inspection device for an active matrix panel.

FIG. 13 is a flowchart showing the stepwise inspection method which is applied to the basic two-TFT circuit as shown in FIG. 4B. In this inspection method, first of all, the select lines (Select) and the data lines (Data) are set to the GND state (Step S201). Next, all the select lines are selected and a voltage sufficient for turning OFF the driving TFTs is applied thereto so as to set all the driving TFTs to the OFF state (Step S202). Thereafter, a voltage is applied to the data lines in the state where all the select lines and the data lines are set to the GND state (Step S203). In this event, a transient current flows from the pixel electrode side to the GND through the parasitic capacitance. The transient current is measured by the integration circuit 150, which is connected to the GND line as shown in FIG. 7 (Step S204). An output from the integration circuit 150 is converted into digital data by use of the A/D converter circuit provided to the measurement control circuit 13 and taken into the computer 12. Hence the data are stored in a predetermined memory provided in this computer 12 as voltage values Voff of the respective data lines (Step S205). The results of this measurement represent the voltage values which are equivalent to the parasitic capacitance values when all the driving TFTs are set to the OFF state. It is to be noted, however, that each of the values represents addition of all the pixels aligned in the direction of the data line as the voltage is applied to the data line.

Next, all the pixels are selected and a voltage sufficient for turning ON the driving TFTs is applied from the data line, so that the driving TFTs of all the pixels are set to the ON state (Step S206). However, when the gate voltage of the driving TFT possesses a low initial voltage in such as the voltage programming mode using four TFTs as shown in FIGS. 8A and 8B, the charge pumping operation is executed through the parasitic capacitance. Meanwhile, in the current programming mode, the driving TFT is set to the ON state by. means of conducting an electric current on the data line. The gate-source voltage in this event is accumulated in the pixel capacitor Cs. Thereafter, the select lines of all the pixels are turned OFF to be set to a non-selective state. Then, the data line (Data) is also set to the GND state (Step S207). Moreover, the same voltage as the voltage applied in Step S203 is applied to the data line (Step S208). In this event, a transient current flows again from the pixel electrode side to the GND through the parasitic capacitance. This transient current is measured by the integration circuit 150 as similar to Step S204 (Step S209). A result of measurement is converted into digital data and a voltage value Von on each data line is stored in the predetermined memory provided in the computer 12 (Step S210).

In this way, of the Voff and Von values obtained in Steps S205 and S210, the minimum value of the Voff and the maximum value of Von can be estimated to represent the data line in which the driving TFTs are operating normally. Accordingly, if the minimum value and the maximum value are defined as Voff. min and Von. max, respectively, it is possible to estimate the number of the short defects and the number of the open defects in each data line (Step S211) as follows:

$$Von.\ max - Voff.\ min = N * Vdiff$$

$$Voff - Voff.\ min = Nshort * Vdiff$$

$$Von.\ max - Von = Nopen * Vdiff$$

Here, N denotes the number of pixels on the data line, Nshort denotes the number of short defects in the data line, and Nopen denotes the number of open defects in the data line.

Then, after specifying the data line including the defects as described above, the driving TFT of each pixel on the specified data line is set to the ON state (Step S212), and a transient current flowing from the pixel electrode side to the GND through the parasitic capacitance is measured with the integration circuit as similar to Step S106 of FIG. 5 (Step S213). In this way, the voltage value Von is obtained and the position of the defective pixel is specified from a result of the voltage value (Step S214). With the procedures described above, it is possible to inspect the numbers of short defects and open defects at high speed and to specify the positions of the defective pixels at high speed.

As described above, this embodiment focuses on the parasitic capacitance between the power line (GND) connected to one of the electrodes of the driving TFT and the inspection wiring (such as the data line (Data)) which is not DC-coupled with the power line (GND) in the active matrix OLED panel (the AMOLED panel), and observes input and output of the electric charges to and from the power line (GND) being the source side wiring, which are associated with variation in the voltage on the inspection wiring in the respective states of ON and OFF of the driving TFT subject to measurement. In this way, it is possible to measure the variation in parasitic capacitance between the ON state and the OFF state of the driving TFT. Moreover, this embodiment also focuses on the fact that no variation in parasitic capacitance occurs in the driving TFT which includes either an open defect or a short defect. In this way, the embodiment achieves inspection of the open/short defects in the driving TFTs.

In this event, it is possible to obtain the number of pixels including the driving TFTs with the open/short defects out of all the pixels by means of measuring the variation in parasitic capacitance in all the pixels. Moreover, it is also possible to estimate the unevenness caused upon formation of the pixel circuits from the unevenness in the variation in parasitic capacitance among all the pixels. Furthermore, regarding each line of the inspection wiring constituting the panel, the parasitic capacitance is estimated on all the pixels subjected to AC coupling directly with the inspection wiring (which are the pixels that belong to a relevant column in the case of the data line, for example) while setting the driving TFTs thereof to the ON state. In this event, it is possible to estimate the number of the pixels including the driving TFTs with open defects by finding a difference between the maximum value of the estimated parasitic capacitance values and an individual parasitic capacitance value. In addition, regarding each line of the inspection wiring constituting the panel, the parasitic capacitance is estimated on all the pixels subjected to AC coupling directly with the inspection wiring (which are the pixels that belong to a relevant column in the case of the data line, for example) while setting the driving TFTs thereof to the OFF state. In this event, it is possible to estimate the number of the pixels including the driving TFTs with short defects by finding a difference between the minimum value of the estimated parasitic capacitance values and an individual parasitic capacitance value. Here, it is also possible to configure the inspection method so as to estimate proportions of the open defective pixels and the short defective pixels to the total number of the defective pixels.

In the meantime, regarding each line of the inspection wiring constituting the panel, the parasitic capacitance is estimated on all the pixels subjected to AC coupling directly with the inspection wiring (which are the pixels that belong to a relevant column in the case of the data line, for example) in the cases of setting the driving TFTs thereof simultaneously to the OFF state and to the ON state. Then, the number of open/short defects in each line of the inspection wiring is estimated from differences among the minimum values, the maximum values, and the parasitic capacitance of each line of the inspection wiring. Thereafter, the respective pixels in the lines of the inspection wiring including the open/short defects are extracted and inspected. In this way, it is possible to estimate the open/short defects in the defective pixels at high speed.

As described above, regarding a TFT array prior to mounting an OLED, this embodiment is capable of judging open/short defects in driving TFTs in respective pixels, measuring the numbers of open defects and short defects inside a panel, and evaluating unevenness in design dimensions of pixel circuits without contacting pixel electrodes. That is, it is possible to find out the numbers of open/short defects in the driving TFTs and to inspect the numbers of bright points and dark points (dead points) which are evaluation items of a display unit, at a stage of the TFT array. By judging defects in the panels based on the results described above, it is possible to substantially reduce an amount of defective products to be forwarded to a subsequent process. In this way, it is possible to reduce costs for manufacturing the panels. Meanwhile, it is possible to estimate accuracy on formation of the pixel circuits by calculating unevenness in the Von−Voff values of the normally operating pixels inside the panel. In addition, this embodiment can be also used for the purpose of managing the processes in the TFT array process by inspecting unevenness among the panels. Furthermore, it is preferable to configure the inspection method to estimate the parasitic capacitance in the state where the driving TFTs of all the pixels driven by the inspection wiring through the parasitic capacitance are simultaneously set to the OFF state and where the driving TFTs are simultaneously set to the ON state, because it is possible to estimate the numbers of open/short defects more promptly. In addition, reduction in development period is expected at a panel development phase by use of the test device 10 shown in FIG. 2 as for failure analysis.

Although this embodiment has been described on the example of using n-channel driving TFTs, the present invention is also applicable to the case where p-channel driving TFTs are used. When the p-channel driving TFTs are used, a non-inverting input (a positive input of the operational amplifier 151 shown in FIG. 7) of the integrated circuit 150 shown in FIG. 7 may be changed from the GND to a power source (Vd). In other words, it is satisfactory as long as the integration circuit 150 is connected to the source side wiring of the driving TFT, regardless of whether the source side wiring is the GND side of the n-channel driving TFT or the power source (Vd) side of the p-channel driving TFT.

As described above, according to the present invention, it is possible to judge open/short defects of driving TFTs in a TFT array for an AMOLED panel promptly prior to a process for forming an OLED thereon.

Although the preferred embodiment of the present invention has been described in detail, it should be understood that various changes, substitutions and alternations can be made therein without departing from spirit and scope of the inventions as defined by the appended claims.

What is claimed is:

1. An inspection device for an active matrix panel for inspecting an active matrix panel prior to formation of an organic light emitting diode, comprising: voltage changing means for changing a voltage applied to inspection wiring for a driving thin film transistor constituting the active matrix panel; and measuring means for measuring a transient current flowing on wiring on a source side of the driving thin film transistor when the voltage on the inspection wiring is changed by the voltage changing means, and for measuring variation in parasitic capacitance between an off state and an on state of the driving thin film transistor.

2. The inspection device for an active matrix panel according to claim 1, wherein the measuring means measures the variation in the parasitic capacitance in all pixels constituting the active matrix panel and finds the number of pixels having any of open and short defects in the driving thin film transistors thereof.

3. The inspection device for an active matrix panel according to claim 1, wherein the measuring means measures the transient current by use of an integration circuit connected to the source side wiring and takes an output from the integration circuit into a computer after converting the output into digital data.

4. An inspection device for an active matrix panel for inspecting an active matrix panel prior to formation of an organic light emitting diode according to claim 1, further comprising: off-state parasitic capacitance measuring means for measuring said parasitic capacitance through a pixel electrode in the off state of a driving thin film transistor constituting the active matrix panel; on-state parasitic capacitance measuring means for measuring the parasitic capacitance through the pixel electrode in the on state of the driving thin film transistor; and inspecting means for inspecting any of open and short defects of the driving thin film transistor based on the parasitic capacitance measured by the off-state parasitic capacitance measuring means and the parasitic capacitance measured by the on-state parasitic capacitance measuring means.

5. The inspection device for an active matrix panel according to claim 4, wherein the on-state parasitic capacitance measuring means performs charge pumping through the parasitic capacitance when a gate voltage of the driving thin film transistor has a low initial voltage.

6. The inspection device for an active matrix panel according to claim 4, wherein the on-state parasitic capacitance measuring means estimates the parasitic capacitance on each line of inspection wiring constituting the active matrix panel while setting the driving thin film transistor of a pixel subjected to alternating-current coupling directly with a corresponding line of the inspection wiring to an on state, and the inspecting means estimates the number of pixels having open defects in the driving thin film transistors thereof by use of a difference between a maximum value of the estimated parasitic capacitance and individual parasitic capacitance.

7. The inspection device for an active matrix panel according to claim 4, wherein the off-state parasitic capacitance measuring means estimates the parasitic capacitance on each line of inspection wiring constituting the active matrix panel while setting the driving thin film transistor of a pixel subjected to alternating/current coupling directly with a corresponding line of the inspection wiring to an off state, and the inspecting means estimates the number of pixels having short defects in the driving thin film transistors thereof by use of a difference between a minimum value of the estimated parasitic capacitance and individual parasitic capacitance.

8. The inspection device for an active matrix panel according to claim 4, wherein the off-state parasitic capacitance measuring means estimates the parasitic capacitance on each line of inspection wiring constituting the active matrix panel while setting the driving thin film transistor of a pixel subjected to alternating-current coupling directly with a corresponding line of the inspection wiring to an off state, the on-state parasitic capacitance measuring means estimates the parasitic capacitance on each line of the inspection wiring constituting the active matrix panel while setting the driving thin film transistor of the pixel subjected to alternating-current coupling directly with the corresponding line of the inspection wiring to an on state, and the inspecting means estimates the number of open and short defects on each line of the inspection wiring by use of differences among a minimum value and a maximum value of the estimated parasitic capacitance and individual parasitic capacitance on each line of the inspection wiring.

9. An inspection device for an active matrix panel for inspecting an active matrix panel prior to formation of an organic light emitting diode, comprising:

voltage changing means for changing a voltage on inspection wiring for a driving thin film transistor constituting the active matrix panel;

measuring means for measuring a transient current flowing on wiring on a source side of the driving thin film transistor when the voltage on the inspection wiring is changed by the voltage changing means, and for measuring variation in parasitic capacitance between an off state and an on state of the driving thin film transistor; and unevenness estimating means for estimating unevenness caused upon formation of pixel circuits constituting the active matrix panel based on the variation in the parasitic capacitance measured by the measuring means.

10. An inspection device for an active matrix panel for inspecting an active matrix panel prior to formation of an organic light emitting diode, comprising: off-state parasitic capacitance measuring means for measuring parasitic capacitance through a pixel electrode in an off state of a driving thin film transistor constituting the active matrix panel; on-state parasitic capacitance measuring means for measuring the parasitic capacitance through the pixel electrode in an on state of the driving thin film transistor; and inspecting means for inspecting any of open and short defects of the driving thin film transistor based on the parasitic capacitance measured by the off-state parasitic capacitance measuring means and the parasitic capacitance measured by the on-state parasitic capacitance measuring means.

11. The inspection device for an active matrix panel according to claim 10, wherein the on-state parasitic capacitance measuring means performs charge pumping through the parasitic capacitance when a gate voltage of the driving thin film transistor has a low initial voltage.

12. The inspection device for an active matrix panel according to claim 10, wherein the on-state parasitic capacitance measuring means estimates the parasitic capacitance on each line of inspection wiring constituting the active matrix panel while setting the driving thin film transistor of a pixel subjected to alternating-current coupling directly with a corresponding line of the inspection wiring to an on state, and the inspecting means estimates the number of pixels having open defects in the driving thin film transistors thereof by use of a difference between a maximum value of the estimated parasitic capacitance and individual parasitic capacitance.

13. The inspection device for an active matrix panel according to claim 10, wherein the off-state parasitic capacitance measuring means estimates the parasitic capacitance on each line of inspection wiring constituting the active matrix panel while setting the driving thin film transistor of a pixel subjected to alternating-current coupling directly with a corresponding line of the inspection wiring to an off state, and the inspecting means estimates the number of pixels having short defects in the driving thin film transistors thereof by use of a difference between a minimum value of the estimated parasitic capacitance and individual parasitic capacitance.

14. The inspection device for an active matrix panel according to claim 10, wherein the off-state parasitic capacitance measuring means estimates the parasitic capacitance on each line of inspection wiring constituting the active matrix panel while setting the driving thin film transistor of a pixel subjected to alternating-current coupling directly with a corresponding line of the inspection wiring to an off state, the on-state parasitic capacitance measuring means estimates the parasitic capacitance on each line of the inspection wiring constituting the active matrix panel while setting the driving thin film transistor of the pixel subjected to alternating-current coupling directly with the corresponding line of the inspection wiring to an on state, and the inspecting means estimates the number of open and short defects on each line of the inspection wiring by use of differences among a minimum value and a maximum value of the estimated parasitic capacitance and individual parasitic capacitance on each line of the inspection wiring.

* * * * *